United States Patent [19]

Chen et al.

[11] Patent Number: 5,141,564
[45] Date of Patent: Aug. 25, 1992

[54] MIXED TERNARY HETEROJUNCTION SOLAR CELL

[75] Inventors: Wen S. Chen; John M. Stewart, both of Seattle, Wash.

[73] Assignee: The Boeing Company, Seattle, Wash.

[21] Appl. No.: 644,069

[22] Filed: Jan. 17, 1991

Related U.S. Application Data

[63] Continuation-in-part of Ser. No. 461,423, Jan. 5, 1990, abandoned, which is a continuation-in-part of Ser. No. 393,040, Aug. 11, 1989, abandoned, which is a continuation of Ser. No. 189,784, May 3, 1988, abandoned.

[51] Int. Cl.$^5$ ............... H01L 31/072; H01L 31/18; H01L 31/0328
[52] U.S. Cl. ........................... 136/258; 136/260; 136/264; 136/265; 357/16; 357/30; 437/4; 437/5; 148/33.2; 148/33.4; 148/33.5
[58] Field of Search ............. 136/258 PC, 260, 264, 136/265; 357/30 E, 30 J, 30 K, 16; 437/4, 5; 148/33.2, 33.4, 33.5; 428/620

[56] References Cited

U.S. PATENT DOCUMENTS

| Re. 31,968 | 8/1985 | Mickelsen et al. | 136/260 |
|---|---|---|---|
| 4,335,266 | 6/1982 | Mickelsen et al. | 136/260 |
| 4,523,051 | 6/1985 | Mickelsen et al. | 136/260 |
| 4,611,091 | 9/1986 | Choudary et al. | 136/260 |
| 4,612,411 | 9/1986 | Weiting et al. | 136/265 |
| 4,680,422 | 7/1987 | Stanbery | 136/249 TJ |
| 4,684,761 | 8/1987 | Devaney | 136/258 PC |
| 4,703,131 | 10/1987 | Dursch | 136/258 PC |
| 4,735,662 | 4/1988 | Szabo et al. | 136/256 |
| 4,795,501 | 1/1989 | Stanbery | 136/249 TJ |
| 4,867,801 | 9/1989 | Stanbery | 136/249 TJ |
| 4,915,745 | 4/1990 | Pollock et al. | 136/265 |
| 5,028,274 | 7/1991 | Basol et al. | 136/264 |

FOREIGN PATENT DOCUMENTS 51-28493  3/1976  Japan ................ 136/260

OTHER PUBLICATIONS

W. Arndt et al., *Proceedings, 6th E.C. Photovoltaic Solar Energy Conference*, (1985), pp. 260-264.
W. E. Devaney et al., *Conference Record, 21st IEEE Photovoltaic Specialists Conf.*, (1987), pp. 535-540.
R. A. Mickelsen et al., *Conference Record, 15th IEEE Photovoltaic Specialists Conf.*, (1981), pp. 800-804.
W. E. Devaney et al., *Proceedings 18th IEEE Photovoltaic Specialists Conference*, (1985), pp. 1733-1734.
R. A. Mickelsen et al., *IEEE Trans. Electron. Devices*, vol. ED-31, May 1984, pp. 542-546.
H. Neff et al., *Appl. Phys. Lett.*, vol. 47, Nov. 1985, pp. 1089-1091.
K. J. Bachmann et al., SERI Contract XL4-04041-1, Annual Report, Mar. 1986.
T. L. Hench et al., *Proceedings, 2nd E.C. Photovoltaic Solar Energy Conf.*, (1979), pp. 379-386.
R. B. Hall et al., *Proceedings, 15th IEEE Photovoltaic Specialists Conf.*, (1981), pp. 777-779.
L. C. Burton et al., *Appl. Phys. Lett.*, vol. 29, Nov. 1978, pp. 612-614.
M. Kwietniak et al., *Proceedings 4th E.C. Photovoltaic Solar Energy Conf.*, (1982), pp. 727-731.
R. C. Potter et al., *Proceedings, 18th IEEE Photovoltaic Specialists Conf.*, (1985), pp. 1659-1664.
N. Romeo et al., *Solar Energy Materials*, vol. 3, pp. 367-370 (1980).
W. S. Chen et al., *Proceedings, 19th IEEE Photovoltaic Specialists Conf.*, (1987), pp. 1445-1447.
N. C. Sharma et al., *Thin Solid Films*, vol. 60, pp. 55-59 (1979).
W. E. Devaney et al., SERI Contract ZL-8-06031-8, Progress Report, Nov. 1987-Oct. 1988, Apr. 1989.

*Primary Examiner*—Aaron Weisstuch
*Attorney, Agent, or Firm*—John C. Hammar

[57] ABSTRACT

A thin film heterojunction solar cell and a method of making it has a p-type layer of mixed ternary I-III-VI$_2$ semiconductor material in contact with an n-type layer of mixed binary II-VI semiconductor material. The p-type semiconductor material includes a low resistivity copper-rich region adjacent the back metal contact of the cell and a composition gradient providing a minority carrier mirror that improves the photovoltaic performance of the cell. The p-type semiconductor material preferably is CuInGaSe$_2$ or CuIn(SSe)$_2$.

92 Claims, 5 Drawing Sheets

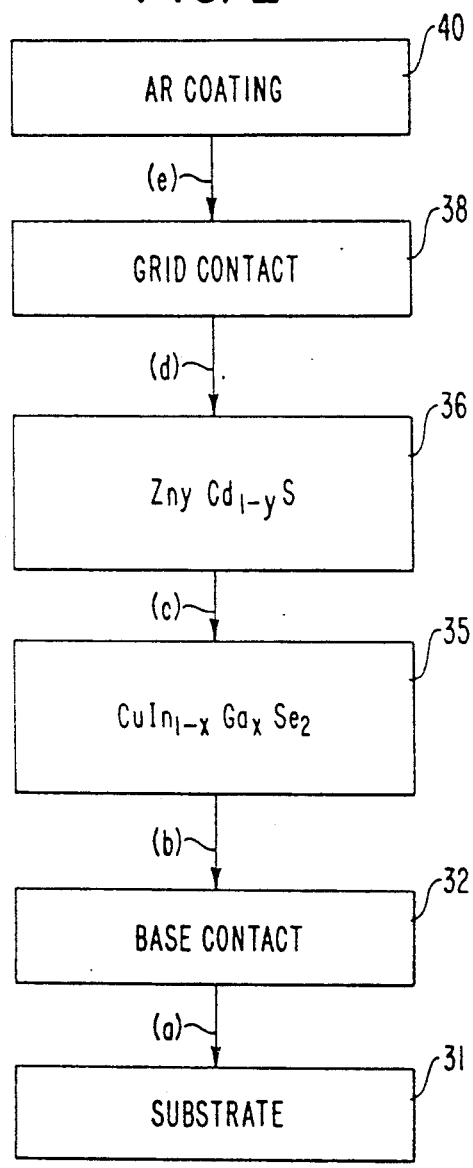

| COMPOSITION INDEX "X" | OPEN CIRCUIT VOLTAGE | SHORT CIRCUIT CURRENT | FILL FACTOR | EFF |
|---|---|---|---|---|
| 1.0 | 0.68 VOLT | 11.21 mA/cm$^2$ | 0.35 | 2.71% |
| 0.5 | 0.54 | 23.81 | 0.52 | 6.72 |
| 0.25 | 0.51 | 30.37 | 0.66 | 10.06 |

MIXED TERNARY HETEROJUNCTION SOLAR CELL

NOTICE OF GOVERNMENT RIGHTS

The Government has certain rights in this invention pursuant to a contract awarded by the U.S. Department of Energy.

RELATED APPLICATIONS

This application is a continuation-in-part application based on U.S. application No. 07/461,423, filed Jan. 5, 1990 (now abandoned), which was a continuation-in-part application based on U.S. application No. 07/393,040, filed Aug. 11, 1989 (now abandoned), which was a continuation application based on U.S. application No. 07/189,784, filed May 3, 1988 (now abandoned).

TECHNICAL FIELD

The present invention relates to thin films of mixed metal compounds, particularly polycrystalline, p-type copper indium gallium selenide mixed ternary semiconductors useful as components in thin film solar cells and methods of making such films.

BACKGROUND OF THE INVENTION

The search for alternative means of producing electrical energy has created significant interest in economical manufacture of solar cells. Such devices should efficiently collect and convert incident light to electrical energy, should have relatively long lives, and should remain reliable through their useful lives.

Thin film, polycrystalline, heterojunction solar cells are well known and have been the subject to numerous publications, such as U.S. Reissue 31,968 to Mickelsen and Chen. which is incorporated by reference. Generally. that patent discloses adjusting the copper/indium ratio in the chalcopyrite $CuInSe_2$ portion of a $CdS/CuInSe_2$ heterojunction to obtain improved conversion efficiencies for the cell.

In U.S. Pat. No. 4,523,051 Mickelsen and Chen disclosed a relatively inexpensive method of making a mixed binary thin film having improved properties over materials made with previous processes. Specifically, they disclosed a method for forming n-type $Zn_xCd_{1-x}S$ for a $ZnCdS/CuInSe_2$ heterojunction solar cell. The process used individual sources for ZnS and CdS of the mixed binary compound and reduced the mean free path of the evaporated elemental particles. The general method of U.S. Pat. No. 4,523,051 is applicable to the present invention and its disclosure is incorporated by reference.

U.S. Pat. No. 4,684,761 to Devaney (incorporated by reference) discloses a $CdZnS/CuInSe_2$ heterojunction solar cell made by controlling particular evaporation rates during deposition of a $CuInSe_2$ film to achieve compositions providing heterojunction cells of high efficiency.

SUMMARY OF THE INVENTION

The present invention is an improved heterojunction solar cell (and its method of manufacture) having excellent conversion efficiencies achieved by using a mixed ternary, copper indium gallium selenide (CIGS) thin film semiconductor in combination with CdZnS to form the photoactive heterojunction. A solar cell of this type is described in papers we wrote with our research colleagues: Chen et al.. "DEVELOPMENT OF THIN FILM POLYCRYSTALLINE $CuIn_{1-x}Ga_xSe_2$ CELLS," Conf. Record, 19th IEEE Photovoltaic Specialists Conf. New Orleans, La., May 4-8, 1987, published Oct., 1987, (which is incorporated by reference); and Devaney et al., 4-$cm^2$ $CuInGaSe_2$ BASED SOLAR CELLS, Conf. Record, 21st IEEE Photovoltaic Specialists Conf., May, 1990, pages 535-540 (also incorporated by reference).

A solar cell incorporating a thin film, polycrystalline, heterojunction of the present invention includes a conductive metal layer or back metal contact on a suitable substrate, a photoactive, polycrystalline, mixed ternary I-III-$VI_2$, p-type semiconductor on the contact, and a polycrystalline, photoactive, mixed binary II-VI semiconductor over the mixed ternary semiconductor to form a heterojunction. In one embodiment, the mixed ternary material is $CuIn_{1-x}Ga_xSe_2$ where x is generally in the range of from 0.25-0.35, although the film may be made in all chemical proportions depending on the particular circumstances of its intended use. Adjusting the ratio of indium to gallium adjusts the bandgap of the material. A composition gradient of Ga and In in the direction of the thickness across the mixed ternary thin film is used to form, in a preferred embodiment, a minority carrier mirror within the p-type semiconductor. The mixed ternary material also preferably has a low resistivity Cu-rich region adjacent the back metal contact.

A top contact and suitable anti-reflection coatings are deposited over the mixed binary material to complete the cell.

Preferably, the composition gradient is characterized by the layer of CIGS material being simultaneously relatively Ga-rich and Cu-rich adjacent the back metal contact, and, consequently, Ga-deficient and Cu-deficient adjacent the heterojunction. In this way, a minority carrier mirror is formed below the junction because of the change in bandgap of the CIGS film produced with the change in composition. While our preferred device has two layers in the CIGS thin film, one Ga-rich and the other Ga-deficient, it might be preferable to slowly and continuously reduce the [Ga] in the film during the deposition from the back metal contact to the junction or to use several bands of differing [Ga] rather than to simply create a single discontinuity (i.e., step change) in the [Ga]. That is, a true gradient across the mixed ternary film rather than a step reduction in [Ga] may be preferred.

BRIEF DESCRIPTION OF THE DRAWINGS

FIG. 2 is a schematic block diagram depicting a typical solar cell and its method of manufacture.

DETAILED DESCRIPTION OF THE PREFERRED EMBODIMENTS

As used throughout this specification, "[λ]" means the concentration of the "λ." Most frequently this symbol will be used as shorthand for the concentration of gallium, thus "[Ga]." In the same manner, we use the symbols $CuInGaSe_2$, $CuIn_{1-x}Ga_xSe_2$, or CIGS as shorthand to represent copper indium gallium selenide mixed ternary, thin film semiconductor materials and comparable chemical representations for the mixed binary material and other components of the solar cells, as will be understood by those of ordinary skill in the art.

Figure 1:
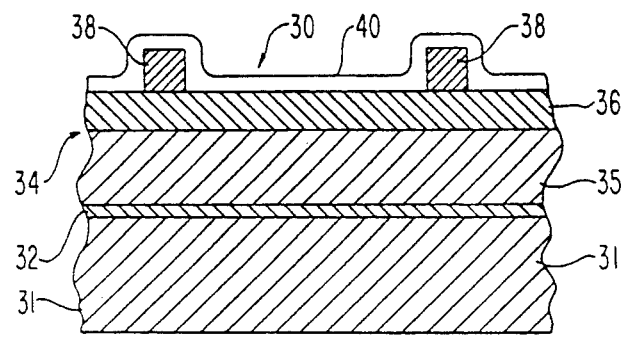
FIG. 1 is a partial cross-sectional view of a solar cell of the present invention.

In FIG. 1, a thin-film p-n-type heterojunction solar cell 30, having several active layers 35, 36 of differing thickness, has an overall thickness ranging from 5-10 μm (excluding the thickness of the substrate 31 which may be on the order of approximately 0.025"). Such thin-film cells 30 are to be contrasted with conventional single crystal, silicon-type solar cells and concentrator solar cells wherein the thickness of the active portions of the cell may range from 200 μm to 400 μm.

A suitable substrate 31 is polycrystalline alumina ($Al_2O_3$) or any other suitable substrate including those identified in U.S. Re. 31,968, U.S. Pat. No. 4,684,761, or U.S. Pat. No. 4,701,131. That is, the substrate 31 may be glazed alumina, glass, enameled steel, metal foils (including titanium), and similar inert inorganic materials, provided only that the material selected is capable of withstanding the process temperatures involved, which range up to about 550° C. In addition, the substrate 31 should not interact with the active layers 35 and 36 of the cell and should also have a coefficient of thermal expansion compatible with the active layers.

A suitable back metal contact 32 (i.e., conductive metal layer) is deposited on one surface of the substrate 31. Excellent results are obtained using molybdenum, but other materials could also be used. For example, a molybdenum/gold combination, nickel, or graphite (which have been commonly employed in conventional solar cells) may also be used.

Figure 6:
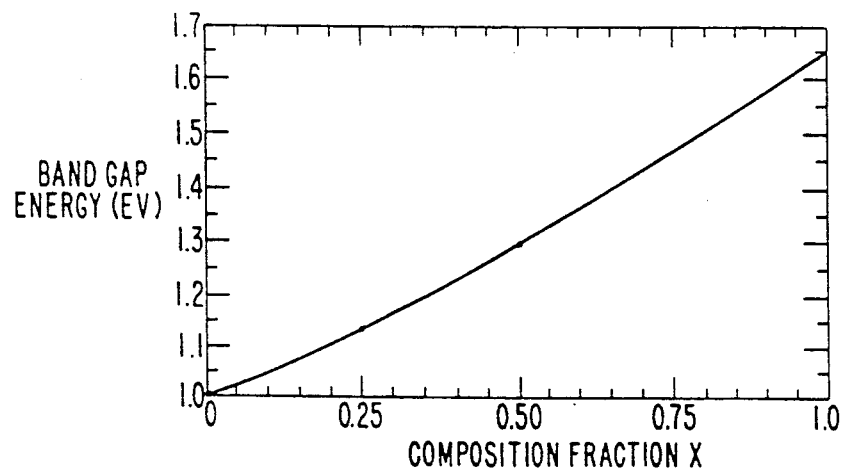
FIG. 6 is a graph showing the bandgap energy of $CuIn_{1-x}Ga_xSe_2$ as a function of x.

Semiconductor layers define the photoactive junction 34. Here, a heterojunction is formed at the interface between two different active semiconductor layers 35 and 36. The preferred heterojunction has a relatively narrow band gap energy ranging from about 1.0 to 1.7 eV (FIG. 6), and, typically, is tuned for optimal performance to the incident solar spectrum present in the intended use.

Mixed ternary, polycrystalline, chalcopyrite compounds, especially those of the I-III-VI$_2$ type, have shown particular promise as one film in the cell. By varying the ratio of the elements in the mixed ternary film and, specifically, by varying the Cu/(In+Ga) ratio during deposition of the $CuIn_{1-x}Ga_xSe_2$ semiconductor layer, the electrical properties can be adjusted, and high electrical conversion efficiency obtained.

The preferred CIGS layer 35 is p-type material consisting of $CuIn_{1-x}Ga_xSe_2$ where x is 1-1.0, and preferably from about 0.25 to 0.35, at least in the region of the layer adjacent the back metal contact 32. This region of the CIGS layer also preferably has a low resistivity Cu-rich region that forms a more effective electrical interface with the contact 32. The Cu-rich region is produced by altering the vaporization rate from a Cu source during the deposition as described in U.S. Re. 31,968; or U.S. Pat. No. 4,684,761; or later in this specification.

The Cu-rich region generally has a thickness of about 2 micrometers, and is grown by elemental evaporation at a substrate temperature of about 400°-500° C., and, preferably, 400° C. to 450° C. in a batch deposition chamber. In one embodiment of the present invention, the deposition rate of Cu is reduced thereafter while depositing the remainder of the CIGS layer 35, and the substrate temperature is increased to about 450° C. to 550° C. Preferably, this upper Cu-poor, higher resistivity portion of the CIGS layer 35 has a thickness of about 1 micrometer. Preferably this upper portion also has a lower [Ga].

The ratio of [In] to [Ga] generally is changed in the upper portion to provide a composition gradient of Ga (and hence In) across the thickness of layer 35. Generally, we prefer to reduce the [Ga] to create a minority carrier mirror in the CIGS layer. The region of the CIGS near the back contact has a higher bandgap energy (eV) than the region adjacent the junction when such a change occurs (FIG. 6) and electrons (or, more accurately, minority carriers) are confined to the active upper layer by the energy barrier created by the bandgap disparity. When so confined, reduction of minority carrier recombination at the back contact will result in the efficient production of electrical power.

We prefer to make two different kinds of CIGS films. One has a minority carrier mirror, the other has a constant composition of gallium. We will next describe how to make both films.

To make a graded CIGS film that includes a minority carrier mirror, we prefer to include a step change or discontinuity in the [Ga] across the film. The highest [Ga] appears in the Cu-rich portion of the film that is adjacent the back metal contact 31, and it is convenient to reduce the gallium flux (i.e., vaporization rate) at the same time as we reduce the copper flux. While we call the film "graded" in gallium, it actually has essentially only two regions, one gallium-rich, the other gallium-deficient. Of course, films with multiple steps in the gallium concentration that create a minority carrier mirror might also be used, but we have not actually made these films and do not understand their performance. Also, the film might actually have a true gallium gradient (i.e., a slowly varying, continuous change in [Ga]) from rich to poor to create a built in electric field to assist in the collection the minority carriers.

The minority carrier mirror should be formed relatively close to the photoactive heterojunction, so we Prefer the simple two-step deposition process (i.e., gallium-rich followed by gallium-poor) to form the mirror. Other processes that we have described may optimize cell conversion efficiency but must await testing until production of reliable CIGS films is mastered for high volume, in-line production.

Not all the CIGS films that we make include a gallium gradient, yet all the films we make still appear to produce heterojunctions having higher conversion efficiencies than their CIS counterparts. Therefore, we consider CIGS cells and their processes of manufacture to be important for the commercial success of these heterojunction cells for terrestrial applications.

In making CIGS films with a constant [Ga] in a batch deposition reactor, such as a CHA Mark-50 chamber, we first load molybdenum-coated alumina substrates to the fixed or planetary deposition fixture at the top of the chamber. We Pump down the chamber to the desired high vacuum conditions described in Boeing's earlier patents and simultaneously introduce gallium, copper, indium, and selenium into the chamber from independently heated and controlled, isolated sources. The substrates are initially heated from the backside generally to a temperature of about 450° C. For flux rates of about 1 A/sec Cu:2 A/sec In: 0.3 A/sec Ga: 8 A/sec Se, we deposit a first Cu-rich region for about 30 minutes. Then, we elevate the substrate temperature to about 550° C. while adjusting the copper flux to about 0.7 A/sec, and we continue the deposition of the Cu-poor (i.e., "copper-deficient"), near-junction region for another 15 min. The resulting CIGS film has a constant [Ga] across the film of about 0.25. That is, in the formula: $CuIn_{1-x}Ga_xSe_2$, $x=0.25$. The preferred range for [Ga] is $x=0-0.3$.

Cells of this general type are described in the two papers we have incorporated by reference.

The inclusion of Ga in a I-III-VI$_2$ semiconductor imposes several constraints on the deposition process. First, gallium requires use of a higher substrate temperature than you would ordinarily use to make an analogous CIS film. Second, gallium-rich layers (i.e., $x>0.35$) are susceptible to surface oxidation. Gallium-rich materials must, therefore, be protected or isolated from oxidizing environments before deposition of CdZnS.

In films that include a minority carrier mirror, electrons and holes formed by incident light on the heterojunction are prevented from recombining at the back metal contact, because the energy barrier created by the higher bandgap creates a field that repels electrons. Electron microprobe analysis confirms that the concentration gradient of Ga is maintained during the useful life of graded CIGS devices because of the low mobility of Ga in $CuIn_{1-x}Ga_xSe_2$.

Films of $CuInS_{2y}Se_{2(1-y)}$ can also be used, because they are heterojunction mixed ternary materials that include a minority carrier mirror. Here, the $CuInS_{2y}Se_{2(1-y)}$ can be formed with a low resistivity, high [Cu] adjacent the back metal contact, and the ratio of S/Se can be varied to decrease the [S] adjacent the junction in the same way that a Ga gradient is achieved. In the formula, $y=0-1.0$, and preferably 0-0.3. We prefer to make CIGS cells.

Control of evaporation rates for the various elements is accomplished by a quartz crystal controller for Se and an electron impact emission spectroscopy evaporation rate controller for the Cu, Ga, and In. The substrates are heated with quartz lamps.

Figure 4:
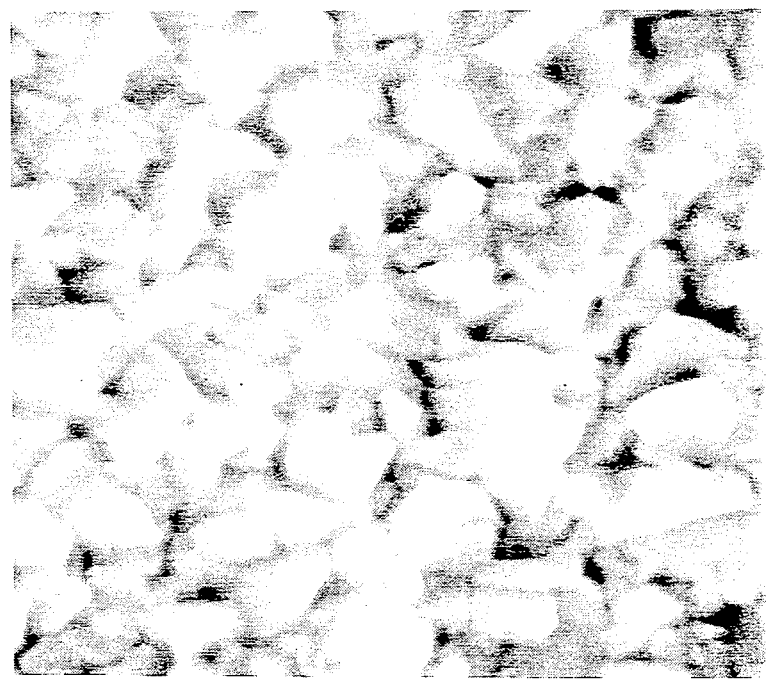
FIG. 4 is a SEM photomicrograph at 10,000× magnification showing the preferred microstructure of the $CuIn_{1-x}Ga_xSe_2$ layer.

The preferred CIGS microstructure has general uniformly sized angular grains of the size depicted in FIG. 4. Improper process parameters or compositions may result in a variation in grain size which has an adverse effect on device performance. It is known that if the grain size is not generally uniform, smaller grains are found in the interstices of larger grains and poor photovoltaic performance results. This is normally the result of deposition when substrate temperatures are too low.

CIGS can be paired with a II-VI film 36 to form a photoactive heterojunction. We prefer to use $Zn_zCd_{1-z}S$ wherein $0 \leq z \leq 0.1$, preferably $0 \leq z \leq 0.5$, more preferably, $0.12 \leq z \leq 5.0$, and, generally, $z=0.12$. We generally designate $Zn_zCd_{1-z}S$ simply as CdZnS.

A suitable grid contact 38 or other suitable collector is deposited on the upper surface of the II-VI film 36.

The grid contact 38 may be formed from various materials but should have high electrical conductivity and form a good ohmic contact with the underlying film 36. Excellent results have been attained using vacuum deposited aluminum on $Zn_zCd_{1-z}S$ or the like. Other materials might be used to provide the contact such as indium, chromium, or molybdenum with an additional conductive metal overlayment, such as copper, silver, nickel or the like. In some cases the top contact might even be ZnO in a monolayer or bilayer, as described in our copending U.S. application No. 07/569,411.

One or more anti-reflective coatings 40 usually are used to improve the cell's collection of incident light. We prefer a layer of amorphous silicon nitride applied by plasma-enhanced chemical vapor deposition followed by a second layer of amorphous silicon oxide. Of course, any other suitable anti-reflective coating could be used.

The base metal contact 32 is applied to the substrate 31 generally by Rf-sputtering, vacuum deposition, vapor deposition, or the like.

The minority carrier mirror must be separated from the back metal contact by a sufficient distance to eliminate degrading the performance of the device by the recombination of holes with the electrons from the metal layer.

Preferably, the n-type $Zn_zCd_{1-z}S$ film 36 is a low resistivity layer vacuum deposited in a carefully controlled process to a depth preferably on the order of about 3 $\mu$m to permit light to penetrate this film and to reach the junction.

Near the junction we prefer that the CdZnS film 36 to be undoped. Away from the junction the CdZnS film is doped with gallium or indium. The undoped region ranges in thickness from 0.5-1.5 $\mu$m and the doped region ranges in thickness from 1.0-3.0 $\mu$m. We try to make the film 36 as thin as Possible without sacrificing performance.

Laboratory 1 cm$^2$ solar cells were formed utilizing grid lines as a top contact of approximately 25 $\mu$m in width with ten equally spaced parallel lines per centimeter, defining a transparent grid structure exposing from 93% to 95% of the underlying semiconductor layer 36.

Figure 3:
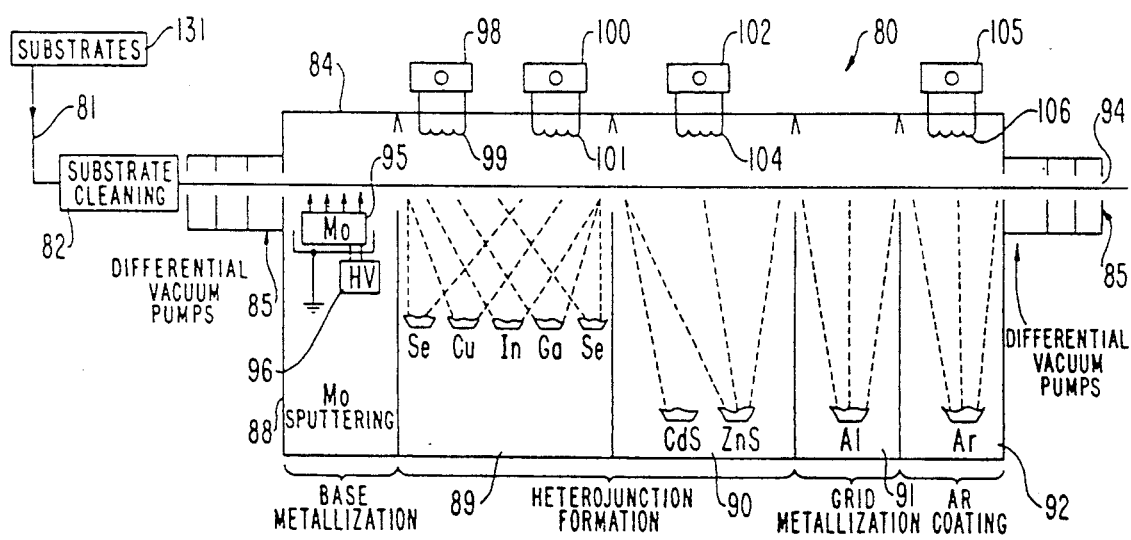
FIG. 3 is a schematic of an in-line deposition apparatus adapted to form cells of the present invention.

FIG. 3 schematically illustrates an in-line system 80 for forming the materials of the present invention. Substrates 131 are continuously fed along a suitable conveyor system 81 through a substrate cleaning station 82 before entering a vacuum chamber 84, having differential vacuum pumps 85 and sequential process areas 88-92. The substrates 131 exit from the vacuum chamber 84 at 94.

Process area 88 of the vacuum chamber 84 is controlled at a temperature and pressure suitable for application of a molybdenum back metal contact 31 to the substrates 131 by sputtering or vacuum deposition techniques. The back metal contact 31 is applied by using a Mo target 95 coupled to a suitable high voltage source 96 in a conventional manner.

Process area 89 is preferably maintained at a temperature on the order of at least 350° C. and ranging to 550° C. by means of an adjustable temperature controller 98. Heating coil 101 may be located at the downstream end of zone 89 for raising the substrate temperature to about 550° C. The coil should be positioned to raise the temperature after about $\frac{2}{3}$ to $\frac{3}{4}$ of the CIGS layer has been deposited. The pressure in area 89 is preferably maintained at about $3-8 \times 10^{-6}$ torr As the substrates 131 successively pass through process areas 90, 91, and 92, the low resistivity CdZnS film 36 (or other suitable II-VI materials having bandgap energies greater than about 1.5 eV), aluminum contact grid 38, and anti-reflective coatings 40 are sequentially applied. The process area 90 generally includes an indium or gallium source (not shown) to facilitate doping of the CdZnS layer. A temperature controller 102 and heat coil or lamp 104 are provided for establishing a controlled temperature level in process area 90 ranging from about 150° C. to about 250° C.; while a similar adjustable controller 105 and heat coil or lamp 106 are provided in process area 92 for maintaining the temperature in a range of about 100° C. to about 125° C. Aluminum is preferably evaporated in process area 91 at ambient temperature and at a pressure less than $5 \times 10^{-6}$ torr. CdS and ZnS are preferably evaporated in process area 90 in the presence of hydrogen at a pressure in the range of from 1 to $3 \times 10^{-4}$ torr.

While excellent results have been obtained using CdZnS as the n-type material, other materials could be used such as ZnO, ZnSe, CdSnO$_4$, CdS$_{1-x}$Se$_x$ or Zn$_x$Cd$_{1-x}$Se. Thus, it is evident that the n-type material is preferably selected from the class of II-VI elements having suitable wide band gap energies greater than 1.5 eV.

The [Zn] in the mixed binary film 36 should be in the range of from 0 to 50 atomic percent and, for CIGS, we prefer a range of about 12–50 (and, generally, 20%) because, in that range, the mismatch in lattice parameters and election affinities is minimized.

Another variation for our invention is to use a very thin n-type layer (less than 500 A) to complete the heterojunction so that the full range of incident light reaches the junction where it can be converted to electricity. Thick CdZnS films absorb light that otherwise would induce minority carriers at the junction. In such a case a low resistivity transparent film on one surface of the n-type layer improves electrical performance of the device. An Al doped ZnO layer has proved to be operable for such a layer.

Figure 5:
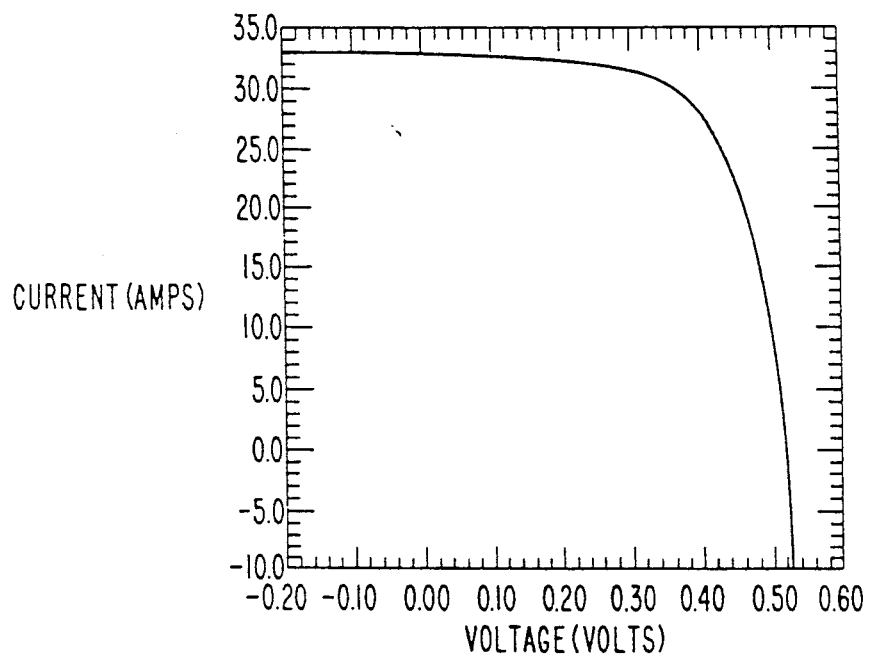
FIG. 5 is a graph showing the typical photovoltaic characteristics of a solar cell of the present invention.

CIGS/CdZnS cells with approximately 25% Ga have shown conversion efficiencies of greater than 10% (FIG. 5).

Figures 7, 8:
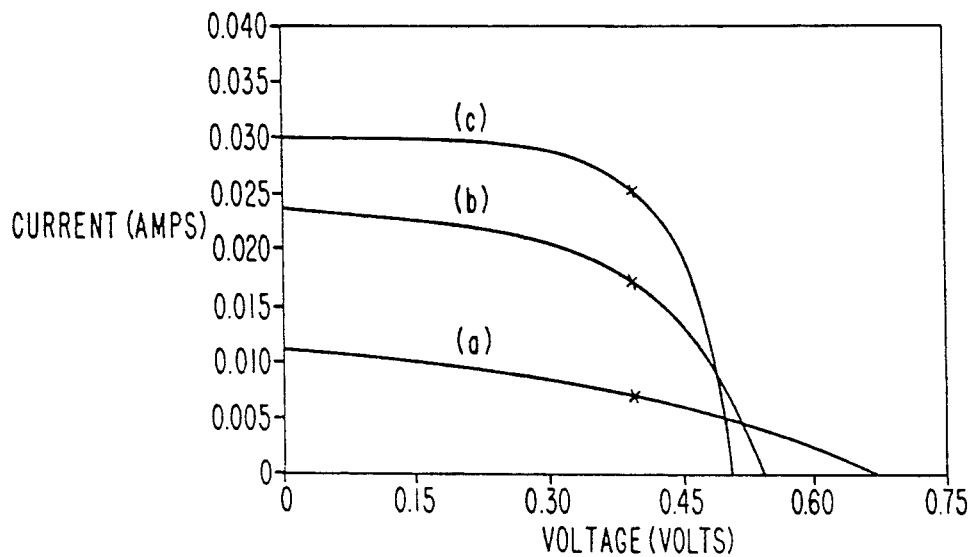
FIG. 7 is a graph showing the current/voltage characteristics of solar cells having various In/Ga ratios.
FIG. 8 is a table showing the photovoltaic characteristics of CIGS solar cells having differing concentrations of gallium.

FIG. 7 illustrates the photovoltaic response of several cells using different [Ga]. The table of FIG. 8 sets out the characteristics of such cells.

Performance of the device is improved if it is heated to about 225° C. for 5 to 20 minutes in oxygen after fabrication.

The invention has been illustrated in terms of a preferred embodiment, but the scope of the invention should not be limited to that embodiment. The embodiment disclosed finds particular utility as a heterojunction solar cell exhibiting high open circuit voltages, high efficiency, high quantum yields, and high photocurrents. Such structures are resistant to degradation and are able to be manufactured at relatively low unit cost. Those skilled in the art, however, may find other applications for the invention.

While preferred embodiments have been shown and described, those skilled in the art will recognize alterations, variations, or modifications which might be made to the embodiments without departing from the inventive concept. The claims should be interpreted liberally in view of the description with support of the full range of equivalents known to those of ordinary skill based upon this description. The claims should be limited only as is necessary in view of the pertinent prior art.

We claim:

1. A thin film polycrystalline heterojunction solar cell, comprising:
   a back metal contact;
   a p-type layer on the contact comprising a mixed ternary, I-III-VI$_2$ polycrystalline semiconductor material having a composition gradient in the direction of the thickness of the layer to form a minority carrier mirror within the layer, the layer having low resistivity region adjacent the back metal contact;
   an n-type layer of semiconductor material on the p-type layer to form a photovoltaically active heterojunction; and
   electrically conductive means on the n-type layer.

2. The cell of claim 1 wherein the p-type material in CuIn$_{1-x}$Ga$_x$Se$_2$.

3. The cell of claim 2 wherein the minority carrier mirror is formed by changing the concentration of gallium in the p-type layer.

4. The cell of claim 3 wherein the low resistivity region is rich in copper relative to the concentration of copper in the remainder of the layer.

5. The cell of claim 4 wherein said composition gradient is characterized by the p-type layer being relatively rich in gallium within said Cu-rich region.

6. The cell of claim 4 wherein the n-type layer is a mixed binary CdZnS semiconductor.

7. The cell of claim 6 wherein said CdZnS includes In or Ga as a dopant away from the junction.

8. The cell of claim 7 wherein the n-type layer comprises 12–50 atomic percent zinc.

9. The cell of claim 2 wherein the n-type layer is a mixed binary II-IV semiconductor.

10. The cell of claim 1 wherein the minority carrier mirror is defined by a first zone overlying the contact and having a higher bandgap, and a second zone overlying the first zone and having a lower bandgap.

11. The cell of claim 1 wherein said p-type layer has a bandgap in the range of from 1.0 to 1.7 eV.

12. The cell of claim 1 wherein the n-type layer consists essentially of Zn$_z$Cd$_{1-z}$S with z in the range of from 0 to 0.5.

13. The cell of claim 1 wherein the n-type layer is a mixed binary II-VI semiconductor.

14. The cell of claim 1 wherein said n-type layer comprises a material selected from the group consisting of ZnO, ZnSe, CdSnO$_4$, CdSSe, and CdZnSe.

15. The cell of claim 1 wherein said electrically conductive means comprises a metal grid.

16. The cell of claim 15 further comprising an anti-reflective coating applied over the metal grid and the n-type layer.

17. The cell of claim 1 further comprising an anti-reflective coating over the n-type layer.

18. The cell of claim 17 wherein the anti-reflective coating comprises amorphous silicon oxide over silicon nitride.

19. The cell of claim 1 wherein the n-type layer has a thickness of less than about 3 micrometers.

20. The cell of claim 1 wherein the n-type layer has a thickness of less than about 500 angstroms.

21. A thin film polycrystalline heterojunction solar cell comprising:
    a conductive metal layer a p-type layer of CuIn$_{1-x}$Ga$_x$Se$_2$ semiconductor material on said conductive metal layer, wherein x is in the range of from 0 to 0.3, having a composition gradient of Cu and In in the direction of thickness and having a low resistivity Cu-rich region adjacent the conductive metal layer and a relatively Cu-poor region adjacent the junction;

an n-type layer of CdZnS semiconductor material on said p-type material to form a photovoltaically active junction;

an electrically conductive top contact on one surface of the n-type layer; and at least one anti-reflective coating over the top contact.

22. The cell of claim 21 wherein the p-type layer includes a minority carrier mirror.

23. The cell of claim 21 wherein the anti-reflective coating includes amorphous silicon nitride.

24. The cell of claim 23 wherein said anti-reflective coating further includes amorphous silicon oxide over the silicon nitride.

25. The cell of claim 21 wherein the n-type layer has a thickness of less than about 3 micrometers.

26. The cell of claim 21 wherein the n-type layer has a thickness of less than about 500 angstroms permitting light transmission to the junction.

27. A method of making on a substrate a thin film polycrystalline heterojunction solar cell comprised of a conductive metal layer; a p-type layer of polycrystalline, mixed ternary I-III-VI$_2$material material having a low resistivity Cu-rich region adjacent said conductive metal layer, a higher bandgap region, within said Cu-rich region, and a lower bandgap region, the higher and lower bandgap regions defining a minority carrier mirror; a layer of polycrystalline n-type semiconductor material disposed on the p-type layer defining the heterojunction; and an electrically conductive means disposed on said n-type material, said method comprising the steps of:

(a) introducing vapors of the elements from Groups I, III, and VI simultaneously into a vessel to form a vapor mixture comprising the components of the p-type layer;

(b) independently controlling the vaporization rate of the elements;

(c) depositing said vapor mixture on a substrate to form a p-type polycrystalline film of mixed ternary I-III-VI$_2$ material having a copper-rich region and a minority carrier mirror;

(d) depositing the n-type semiconductor material on said p-type material; and (e) depositing an electrically conductive means on the surface of the n-type semiconductor material.

28. The method of claim 27 wherein the minority carrier mirror is formed by varying the rates of deposition of gallium and indium.

29. The method of claim 27 wherein the temperature of the substrate is controlled during the deposition of the p-type film such that the polycrystalline material has a generally uniform grain size.

30. The product of the process of claim 29.

31. The method claim 27 wherein the depositing step for forming the I-III-VI$_2$ material includes depositing the Cu-rich region on the substrate heated to a temperature in the range of from 400° C. to 500° C., and reducing the vaporization rate of copper within the vessel to complete the p-type film at a substrate temperature in the range of 450° C. to 550° C.

32. The method of claim 27 wherein the substrate is maintained at a temperature in the range of 350° C. to 550° C. during step (c).

33. A thin film polycrystalline heterojunction solar cell, comprising:

a conductive metal layer;

a p-type layer of polycrystalline CuInS$_{2x}$Se$_{2(1-x)}$ semiconductor material on the conductive metal layer, wherein x is in the range of from 0 to 1.0, the layer having a composition gradient of S in the direction of the thickness of the layer to form a minority carrier mirror and having low resistivity Cu-rich region adjacent the conductive material layer;

an n-type layer of semiconductor material on the p-type layer to form a photoactive heterojunction; and electrically conductive means on the n-type layer.

34. The cell of claim 33 wherein said composition gradient is characterized by the layer of p-type material being relatively S-rich within the Cu-rich region.

35. The cell of claim 33 wherein the n-type layer is Zn$_y$Cd$_{1-y}$S wherein y is in the range from 0 to 0.5.

36. The cell of claim 33 wherein the n-type layer is selected from the group consisting of ZnO, ZnSe, and CdSnO$_4$.

37. The cell of claim 33 wherein $0 \leq x \leq 0.3$.

38. The cell of claim 33 wherein the minority carrier mirror is formed by varying the rates of deposition of sulfur and selenium.

39. A method of making a thin film polycrystalline heterojunction solar cell on a substrate comprised of a conductive metal layer; a p-type layer of polycrystalline CuIn$_{1-x}$Ga$_x$Se$_2$, wherein x is in the range from about 0 to 1.0, the layer having a low resistivity Cu-rich region adjacent said conductive metal layer, a Ga-rich higher bandgap region within said Cu-rich region, and a lower bandgap region adjacent to said Ga-rich region; a layer of polycrystalline n-type semiconductor material disposed on the p-type layer to form the heterojunction; and an electrically conductive means disposed on the n-type material, said method comprising the steps of:

(a) introducing a vapor of copper to a vessel containing said substrate while simultaneously introducing vapors of gallium, indium, and selenium to form a vapor mixture comprising the components of said p-type layer;

(b) controlling the temperature of said substrate;

(c) independently controlling the vaporization rates of copper, indium, gallium, and selenium;

(d) maintaining the temperature of said substrate at a first temperature while depositing said vapor mixture on said substrate to form said Cu-rich region of said p-type material;

(e) raising the temperature of said substrate to a second temperature and decreasing the Ga/In ratio by decreasing the vaporization rate of gallium;

(f) decreasing the amount of copper in the vapor mixture by decreasing the vaporization rate of copper;

(g) continuing depositing at the new vaporization rates to form a film having the above recited composition profile;

(h) depositing the n-type layer on said p-type layer; and (i) depositing an electrically conductive means on the surface of said n-type layer.

40. A method for making a mixed ternary, I-III-VI thin film semiconductor, comprising the steps of:
  (a) heating a substrate having a back metal contact on an exposed surface to a temperature of about 450° C. in a high vacuum chamber;
  (b) introducing simultaneously a mixed vapor of the preferred elements of Groups I, III, and VI into the vessel at predetermined fluxes for each element;
  (c) depositing a first region on the contact for a predetermined time to form a mixed ternary polycrystalline material;
  (d) altering at least one flux of the elements while increasing the substrate temperature to about 550° C; and
  (e) depositing for a predetermined time a second region over the first region to complete the film, the second region being a mixed ternary polycrystalline material having a different chemical composition from the composition of the first region.

41. The method of claim 40 wherein the step of altering includes reducing the flux of copper.

42. The method of claim 40 wherein the step of altering includes reducing the flux of gallium.

43. The method of claim 40 wherein the step of altering includes simultaneously reducing the fluxes of copper and gallium.

44. The product of the process of claim 41 wherein the film comprises $CuIn_{1-x}Ga_xSe_2$, where $0.25 \leq x \leq 0.35$.

45. The product of the process of claim 43 wherein the film comprises $CuInGaSe_2$, and wherein the first region and second region define a minority carrier mirror.

46. The product of the process of claim 43 wherein the film comprises $CuInGaSe_2$, and wherein the first region has a higher bandgap than the second region.

47. The method of claim 40 wherein the film comprises $CuInGaSe_2$, wherein the step of altering includes reducing the flux of copper and reducing the flux of gallium, and wherein the film includes a copper-rich region adjacent the contact and a minority carrier mirror.

48. The method of claim 40 further comprising the step of depositing a II-VI semiconductor on the I-III-VI$_2$ film to form a photoactive heterojunction.

49. The method of claim 48 wherein the II-VI semiconductor comprises a mixed binary material.

50. The product of the process of claim 49.

51. The product of the process of claim 48.

52. A mixed ternary, I-III-VI$_2$ thin film semiconductor comprising:
  (a) a copper-rich region of $CuInGaSe_2$; and
  (b) a copper-deficient region of $CuInGaSe_2$ overlying the copper-rich region.

53. The semiconductor of claim 52 wherein the copper-rich region includes a gallium-rich region and the copper-deficient region includes a gallium-deficient region.

54. The semiconductor of claim 53 wherein the gallium-rich region and gallium-poor region define a minority carrier mirror.

55. The semiconductor of claim 53 further comprising a II-VI thin film adjacent the copper-deficient region to define a photoactive heterojunction.

56. The semiconductor of claim 55 wherein the II-VI thin film is a mixed binary material.

57. The semiconductor of claim 56 wherein the material is CdZnS.

58. The semiconductor of claim 57 wherein the material has a thickness less than about 3 micrometers.

59. The semiconductor of claim 57 wherein the material has a thickness less than about 500 angstroms for transmission of incident light through the material to the junction.

60. The semiconductor of cliam 55 wherein the gallium-rich region and gallium-deficient region define a minority carrier mirror in the I-III-VI$_2$ semiconductor formed by the change in composition of the semiconductor from a higher bandgap material to a lower bandgap material.

61. The semiconductor of claim 52 further comprising a II-VI thin film adjacent the copper-deficient region to define a photoactive heterojunction.

62. The semiconductor of claim 61 wherein the II-VI thin film is CdZnS.

63. The semiconductor of claim 62 wherein the II-VI thin film has a thickness of less than about 500 angstroms for transmission of incident light through the material to the junction.

64. The semiconductor of claim 61 wherein the II-VI thin film has a thickness of less than about 500 angstroms for transmission of incident light through the material to the junction.

65. A mixed ternary, copper indium gallium selenide material for use in a I-III-VI$_2$/II-VI heterojunction solar cell, comprising:
  (a) a low resistivity relatively high conductivity thin film region positionable adjacent a back metal contact in the cell and having a composition simultaneously rich in copper and gallium; and
  (b) a second thin film region overlying and forming an interface with the low resistivity thin film region and positionable adjacent the junction in the cell, the second thin film region having a composition simultaneously deficient in copper and gallium.

66. The material of claim 65 wherein the interface of the low resistivity region and the second region defines a minority carrier mirror formed by the change in bandgap of the material.

67. The material of claim 65 wherein the low resistivity region comprises about ⅔ of the thickness of the material.

68. The material of claim 65 wherein the concentration of gallium in the low resistivity region is about 0.35 and the concentration of gallium in the second region is about 0.25.

69. The material of claim 68 wherein both regions are polycrystalline and the material is p-type.

70. The material of claim 65 wherein both regions are polycrystalline.

71. The material of claim 65 being p-type.

72. The material of claim 65 further comprising a II-VI thin film adjacent the second thin film region to define the heterojunction.

73. The material of claim 72 wherein the low resistivity region comprises about ⅔ of the thickness of the I-III-VI$_2$ material.

74. The material of claim 73 wherein the II-VI thin film has a thickness less than about 3 micrometers.

75. The material of claim 74 wherein the II-VI thin film is a polycrystalline, mixed binary CdZnS semiconductor.

76. The material of claim 75 wherein the CdZnS semiconductor has an undoped region adjacent the junction.

77. The material of claim 76 further comprising a conductive contact layer of ZnO adjacent the CdZnS semiconductor.

78. A solar cell including the material of cliam 77.

79. A solar cell including the material of claim 76.

80. The material of claim 76 wherein the interface of the low resistivity region and the second thin film region defines a minority carrier mirror formed by the change in bandgap between the regions.

81. The material of claim 73 wherein the II-VI thin film has a thickness of less than about 500 angstroms for transmission of light to the junction.

82. The material of cliam 72 wherein the II-VI thin film is a mixed binary semiconductor.

83. The material of claim 82 wherein the mixed binary semiconductor is CdZnS.

84. A solar cell including the material of claim 72.

85. A solar cell including the material of claim 65.

86. A mixed ternary copper indium gallium selenide material for use in a I-III-VI$_2$/II-VI heterojunction solar cell, comprising:

a constant gallium concentration, polycrystalline material having a low resistivity, copper-rich region positionable adjacent a back metal contact in the cell and having a copper-deficient region overlying the copper-rich region and positionable adjacent the junction of the cell, wherein $0.25 \leq$ the mole fraction of gallium $\leq 0.35$.

87. A solar cell including the material of claim 86.

88. The material of claim 86 further comprising a polycrystalline thin film, CdZnS mixed binary semiconductor adjacent the copper-deficient region to define the junction, wherein the CdZnS semiconductor has a thickness less than about 3 micrometers permitting transmission of light to the junction and has a zinc-rich portion adjacent the junction.

89. A solar cell including the material of claim 88.

90. The material of claim 88 further comprising a conductive contact layer of ZnO adjacent the CdZnS semiconductor.

91. A solar cell including the material of claim 90.

92. A thin film polycrystalline heterojunction solar cell, comprising:

(a) a substrate;

(b) a base contact on one surface of the substrate;

(c) a mixed ternary $CuIn_{1-x}Ga_xSe_2$ p-type semiconductor layer deposited on the base contact and including, (i) a first region adjacent the contact and being simultaneously rich in copper relative to the ratio of Ga and In and rich in Ga relative to In;

(ii) a second region on the first region being simultaneously deficient in copper relative to the ratio of Ga and In and deficient in Ga relative to the first region, and having a bandgap lower than that of the first region;

(d) a mixed ternary n-type semiconductor layer of $Zn_yCd_{1-y}S$ deposited on the second region of the p-type semiconductor to form a photoactive heterojunction the layer including, (i) an undoped region adjacent the heterojunction, and (ii) a low resistivity doped region overlying the undoped region and remote from the heterojunction;

(e) a collector deposited on the n-type semiconductor layer remote from the heterojunction, comprising at least one layer of ZnO; and (f) an antireflection coating deposited over the collector, wherein $0 < x < 0.1$ and $0 < y < 0.50$.

* * * * *